United States Patent [19]

Tang et al.

[11] Patent Number: 5,166,770
[45] Date of Patent: Nov. 24, 1992

[54] SILICIDED STRUCTURES HAVING OPENINGS THEREIN

[75] Inventors: Thomas E. Tang, Dallas; Che-Chia Wei, Plano; Cheng-Eng D. Chen, Richardson, all of Tex.

[73] Assignee: Texas Instruments Incorporated, Dallas, Tex.

[21] Appl. No.: 38,394

[22] Filed: Apr. 15, 1987

[51] Int. Cl.⁵ .......................................... H01L 23/54
[52] U.S. Cl. ................................. 257/770; 257/773
[58] Field of Search ................. 357/59, 71, 67, 42, 357/41; 437/20, 187, 189, 189, 196, 192, 190, 200, 203

[56] References Cited

U.S. PATENT DOCUMENTS

| | | | |
|---|---|---|---|
| 3,906,540 | 9/1975 | Hollins | 357/67 |
| 4,536,945 | 8/1985 | Gray et al. | 357/42 |
| 4,613,885 | 9/1986 | Haken | 357/42 |
| 4,621,276 | 11/1986 | Malhi | 357/42 |
| 4,700,465 | 10/1987 | Sirkin | 357/71 |

FOREIGN PATENT DOCUMENTS

| | | | |
|---|---|---|---|
| 56-164578 | 12/1981 | Japan | 357/71 |
| 0035469 | 2/1984 | Japan | 357/71 |
| 0180169 | 9/1985 | Japan | 357/71 |

OTHER PUBLICATIONS

"Modified Polysilicon Emitter Process", IBM Technical Disclosure Bulletin vol. 22, No. 9 Feb. 1980-Barson pp. 4052-4053.

"Ohmic Contacts to Semiconductor Devices Using Barrier Layers of Aluminum and Titanium" IBM Technical Disclosure-vol. 28, No. 4, Sep. 1985 pp. 1417-1418.

Primary Examiner—Rolf Hille
Assistant Examiner—S. V. Clark
Attorney, Agent, or Firm—Douglas A. Sorensen; Stanton C. Braden; Richard L. Donaldson

[57] ABSTRACT

Preferred embodiments include silicon complementary MOSFETs with titanium silicided junctions (38, 58) and direct contacts of aluminum metallization (61, 62) to the p junctions (58) which avoids the high contact resistance of the silicide (60) to p silicon (58). Preferred embodiments also include silicided polysilicon lines without corresponding silicided MOSFET junctions.

6 Claims, 8 Drawing Sheets

SILICIDED STRUCTURES HAVING OPENINGS THEREIN

BACKGROUND OF THE INVENTION

1. Field of the Invention

The present invention relates to semiconductor electronic devices and fabrication methods, and, more particularly, to silicided structures in silicon devices.

2. Description of the Related Art

Large scale integrated silicon circuits have become so dense that a single chip may contain several million transistors, and economic pressure indicates further increases in packing density and downscaling of feature sizes. As MOS technology is scaled down to below one micron, the use of silicided source and drain junctions is essential to reduce the series resistance of the diffused regions, and titanium silicide has become a preferred approach. Indeed, titanium silicide typically provides a sheet resistance of about $1\Omega/\square$ as compared to typical $n^+$ junction sheet resistance of about $20\Omega/\square$ and $p^+$ junction sheet resistance of about $100\Omega/\square$; see, for example, C. Lau et al. Titanium Disilicide Self-Aligned Source/Drain+Gate Technology, 1982 IEEE IEDM Tech. Digest 714 and M. Alperin et al, Development of the Self-Aligned Titanium Silicide Process for VLSI Applications, 32 IEEE Tr. Elec. Dev. 141 (1985). But then the contact resistance of a metal line to a source or drain junction is the sum of the metal-to-silicide contact resistance plus the silicide-to-junction contact resistance.

Further, the series resistance contributed by a metal to junction contact increases more rapidly than other resistance components: the contact resistance scales roughly as the inverse square of the feature size for small contacts; see R. Dennard et al, Design of Ion-Implanted MOSFET's with Very Small Physical Dimensions, 9 IEEE J. S. S. Cir. 256 (1974) and W. Loh et al, 2-D Simulations for Accurate Extraction of the Specific Contact Resistivity from Contact Resistance Data, 1985 IEEE IEDM Tech. Dig. 586. That is, the contact resistance is the specific contact resistivity ($\Omega\text{-cm}^2$) divided by the contact area ($\text{cm}^2$), and the specific contact resistivity is area independent (if edge effects are negligible) and theoretically can be approximated for degenerately doped silicon as:

$$\exp\left(\frac{2\sqrt{\epsilon m}}{h} \frac{\phi}{\sqrt{N}}\right)$$

with $\phi$ the metal-silicon barrier height, N the doping concentration, m the carrier effective mass, and $\epsilon$ the dielectric permittivity of silicon. As feature size is scaled to below one micron, the metal to junction contact resistance for silicided junctions becomes too large for effective circuit operation due to the high specific contact resistivity of the silicide-to-silicon interface for boron-doped junctions. RC time constants become too long and voltage drops in propagating signals become too great.

Thus there is a problem of high specific contact resistivity in known silicided source and drain junctions as feature size is scaled down.

As feature size is scaled to below one micron, the use of doped polysilicon lines for interconnections becomes impractical due to the high resistivity of doped polysilicon. One approach is to use silicided polysilicon (polycide) lines to lower the sheet resistance. Typically, a layer of polysilicon is deposited and a layer of silicide formed on top, either by deposition of silicide or deposition of metal followed by a silicidation reaction; the polysilicon prevents silicidation of the junctions or moats. The layers are patterned and etched to form the silicided polysilicon lines; however, fine line patterning is difficult because the silicide has a rough surface and silicides are similar to other metals and difficult to selectively etch.

Thus the use of self-aligned titanium silicide technology is essential to the fabrication of submicron very large scale integrated silicon circuits; both the polysilicon lines and the junctions or moats are silicided at the same time to provide highly conductive interconnects. However, the problem of high specific contact resistivity in known source and drain junctions remains.

SUMMARY OF THE INVENTION

The present invention provides low specific contact resistivity for metal to silicon contacts in a silicided silicon structure by precluding formation of at least a portion of the silicide to provide a direct metal to silicon contact and also provides for siliciding polysilicon lines without etching silicide.

In preferred embodiment methods pad oxide is patterned and etched just prior to titanium deposition to leave oxide on boron doped $p^+$ regions at the locations of metal contacts; after deposition the titanium directly reacts with the $p^+$ silicon except where masked by the patterned pad oxide. Then after removal of unreacted titanium, the patterned pad oxide is removed and contact metal deposited through the resulting opening in the silicide. Thus a normal silicidation process can be followed with only the extra pad oxide patterning and etching steps included.

The invention contacts solve the problem of high contact resistance in titanium silicided $p^+$ silicon contacts and may be fabricated without large deviation from the normal titanium silicidation process.

BRIEF DESCRIPTION OF THE DRAWINGS

The drawings are schematic for clarity.

FIGS. 6A-D show in plan and cross sectional views $p^{30}$-$n^+$ moat butting;

DESCRIPTION OF THE PREFERRED EMBODIMENTS

The preferred embodiment contacts can be best understood by first noting some features of the final contact resistance of metal (typically aluminum) to titanium silicided junctions in silicon MOSFETs. The final contact resistance is the sum of the metal to silicide contact resistance plus the silicide to silicon contact resistance; and the later contact resistance dominates, especially for a boron doped p+ junction or a phosphorus doped n+ junction. The normal titanium silicidation process (30 minutes reaction in nitrogen atmosphere at 675° C. reaction plus 30 minutes anneal at 800° C.) yields a specific contact resistivity between TiSi$_2$ and arsenic doped n+ silicon of about 0.1 $\mu\Omega$-cm$^2$ and between TiSi$_2$ and boron doped p+ silicon or phosphorus doped n+ silicon of about 10 $\mu\Omega$-cm$^2$. The 10 $\mu\Omega$-cm$^2$ contact resistivity is about two orders of magnitude layer than the corresponding direct aluminum to silicon specific contact resistivity. But more importantly, the resistivities may increase by up to another two orders of magnitude during high temperature processing such as PSG or OCD reflow or densification at 900° C. Indeed, by varying the anneal temperature from 700° to 900° C. and the junction doping concentration (implantation dose) by an order of magnitude, the specific contact resistivity for TiSi$_2$ to phosphorus or born doped silicon junctions has been found to range between 0.03 $\mu\Omega$-cm$^2$ and 10,000 $\mu\Omega$-cm$^2$; whereas arsenic doped junctions did not show such large variability. It is believed that the higher solubility of boron and phosphorus in TiSi$_2$ leads to a segregation of boron and phosphorus out of the doped junction into the TiSi$_2$ during processing. This segregation lowers the doping concentration in the silicon at the interface with the silicide and thereby raises the specific contact resistivity; recall the exponential dependence of resistivity on the square root of the doping level noted in the Background.

The inventive contacts to silicided silicon avoid the silicide-to-silicon contacts for boron or phosphorus doped silicon; although contacts for silicon doped with both arsenic and phosphorus or both arsenic and boron (counterdoped) may still be made through the silicide.

Figure 1A:
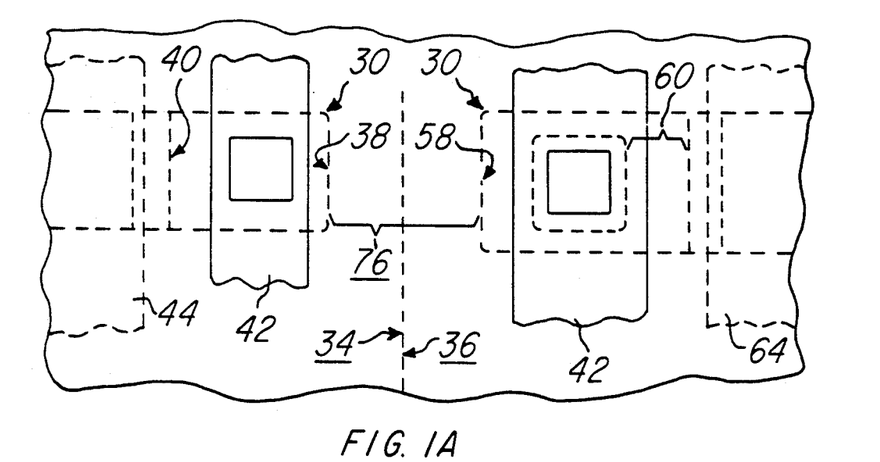
FIGS. 1A-B are plan and cross sectional elevation views of a first preferred embodiment junction contact.
Figure 1B:
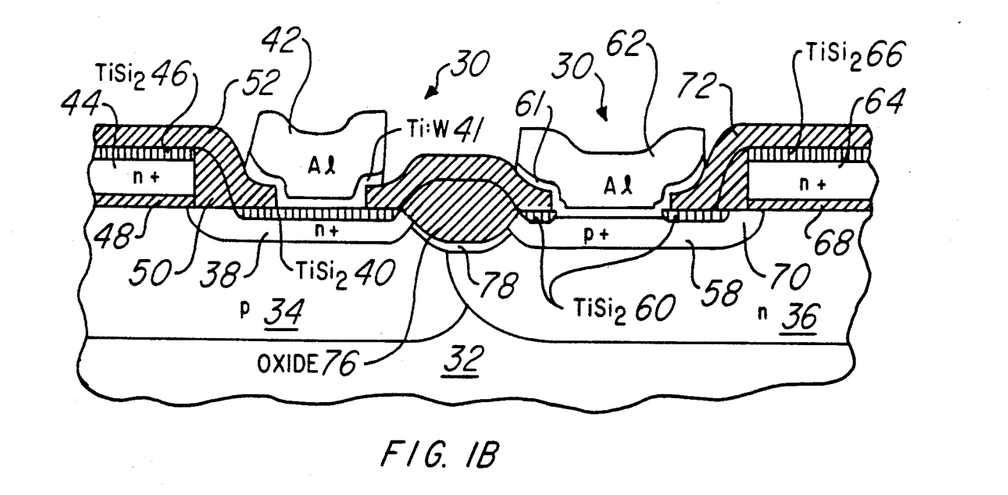

First preferred embodiment contacts in CMOS devices are illustrated in plan and cross sectional elevation views and generally denoted by reference numeral 30 in FIGS. 1A-B; the lefthand portion of the Figures is part of an n channel MOSFET and the righthand portion is part of a p channel MOSFET. Typically, the single large scale silicon integrated circuit will contain MOSFETs similar to those of FIGS. 1A-B repeated in various permutations and variations thousands of times together with other circuit elements such as diodes and interconnections.

In more detail, the devices of FIGS. 1A-B include single crystal silicon substrate 32 is doped p type to form p well 34 for the n channel MOSFET and doped n type to form n well 36 for the p channel MOSFET; the n channel MOSFET includes n+ arsenic doped junction 38 (which is either the source or the drain) covered by titanium silicide layer 40, aluminum contact 42 with titanium:tungsten diffusion barrier 41 on silicide 40, n+ doped polysilicon gate 44 covered by titanium silicide 46 and on gate oxide 48, sidewall oxide 50, and insulation 52; the p channel MOSFET includes p+ boron doped junction 58 (which is either the source or the drain) partially covered by titanium silicide layer 60, aluminum contact 62 with titanium:tungsten diffusion barrier 61 directly on junction 58, n+ doped polysilicon gate 64 covered by titanium silicide 66 and located on gate oxide 68, sidewall oxide 70, and insulation 72; and the MOSFETs are separated by field oxide 76 with abutting channel stops 78.

For contacts 30, aluminum contact 62 with diffusion barrier 61 directly contacts p+ junction 58 although titanium silicide covers the remainder of the p+ moat to lower the sheet resistance; in contrast, n+ junction 38 is totally covered by silicide 40 and aluminum contact 42 with diffusion barrier 41 contacts silicide 40 only. Thus the high specific contact resistivity of the titanium silicide to p+ silicon contact is avoided while retaining the advantageous sheet resistance reduction of silicidation. Note that the n+ polysilicon gate lines 44 and 64 were doped with phosphorus and silicided; thus the specific contact resistivity between the silicide and the polysilicon is also high due to the segregation of dopants. But the polysilicon lines have a large area of contact between silicide and polysilicon due to the length of the lines, so the high specific contact resistivity is tolerable. This is also true for the remainder of the p+ moat away from the junctions that is silicided and used as conductive lines.

Further understanding and characteristics of junction contacts 30 follows from consideration of a first preferred embodiment method of fabrication of the CMOS device of FIGS. 1A-B which is illustrated in cross sectional elevation views in FIGS. 2A-E and includes the following steps:

(a) Begin with a standard CMOS substrate: <100> oriented silicon with a p− epilayer 32 several microns thick and n well 36 and p well 34 in epilayer 32. Photolithographically define and implant channel stop 78 and grow field oxide 76 of thickness 7.000 Å. Grow gate oxide (48 and 68) and deposit, pattern and etch first level n+ (POCl$_3$ doped) polysilicon (forming gates 44 and 64) of a thickness of 4,500 Å, and form sidewall oxides 50 and 70 on the gates by conformal deposition followed by anisotropic etching. Deposit 300 Å of TEOS pad oxide 80. Apply and pattern photoresist and implant arsenic (plus some phosphorus) through pad oxide 80 to form n+ source and drain 38. Strip the patterned photoresist, then apply and pattern second photoresist and implant boron through pad oxide 80 to form p+ source and drain 58. Strip the second patterned photoresist and anneal the implants; see FIG. 2A. Note that for design rules with a 1.0 $\mu$m long gate (horizontal dimension of polysilicon 44 or 64 in FIG. 2A) junctions typically have a depth of about 0.3 $\mu$m (vertical dimension of junctions 38 or 58 in FIG. 2A).

Figure 2A:
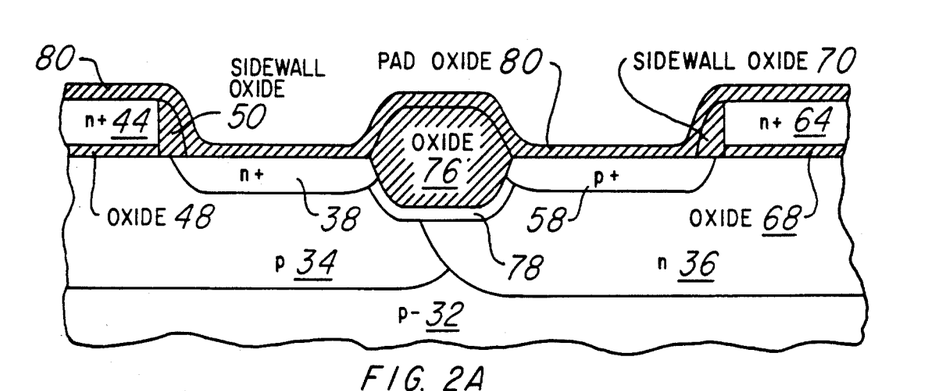
FIGS. 2A-silicide illustrate the steps of a first preferred embodiment method of fabrication of the contact of FIGS. 1A-B.
Figure 2B:
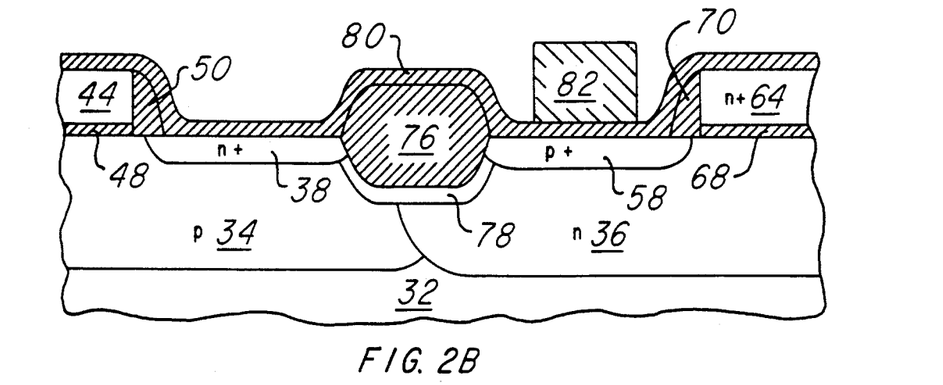
Figure 2C:
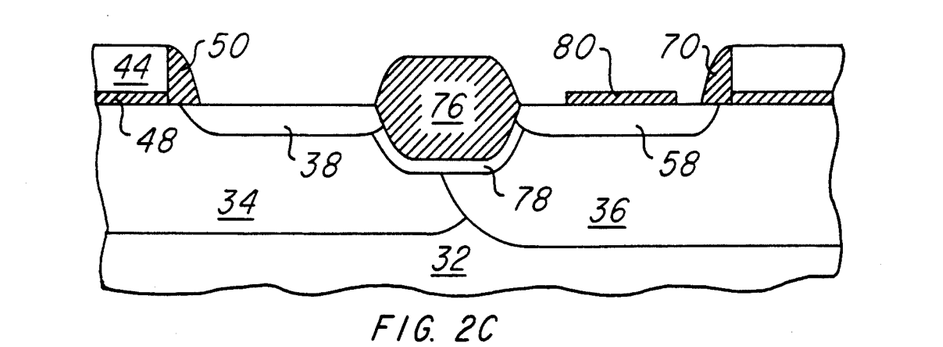
Figure 2D:
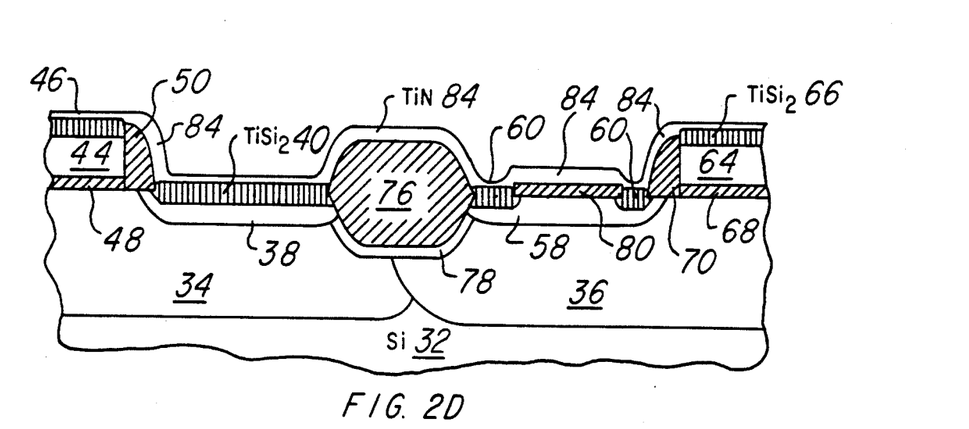
Figure 2E:
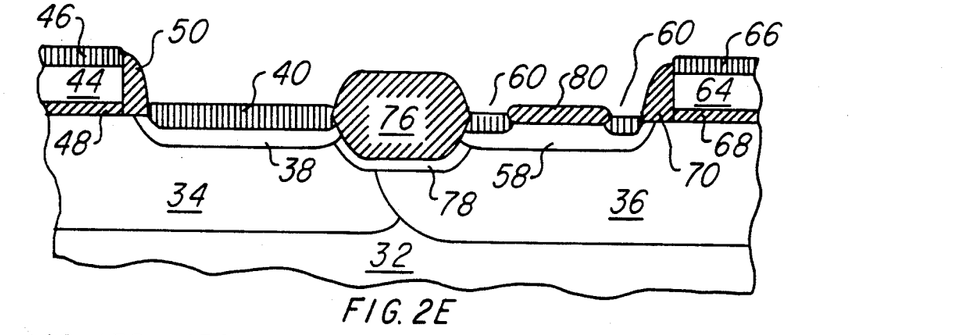

(b) Apply and pattern photoresist 82 to define the contacts to the p+ source and drain 58; see FIG. 2B. Note that this is reverse color.

(c) Plasma etch pad oxide 80 with photoresist 82 as the etch mask. The etch clears pad oxide 80 from polysilicon 44 and 64 and junctions 38 and 58 while only removing a small portion of sidewall oxide 50 and field oxide 76. Strip photoresist 82; see FIG. 2C which illustrates the remnant pad oxide 80 at the locations of contacts to the p+ junction 58. Note that the remainder of the p+ moat is free of remnant pad oxide 80.

(d) Conformally deposit by sputtering a layer of titanium 1,000 Å thick on the structure of step (c). In a nitrogen ambient (one atmosphere pressure) raise the temperature to 675° C. for thirty minutes; at this temperature silicon (from both sources and drains 38 and 58 and from polysilicon 44 and 64) diffuses into the titanium layer and reacts to form titanium silicide 40, 46, 60, and 66 plus nitrogen from the ambient diffuses into the titanium and reacts to form titanium nitride (TiN) 84. The silicidation and nitridation reactions compete and the silicide and nitride layers grow toward each other and formation ceases when the two fronts meet. Further reaction allows the formation of stoichiometric titanium disilicide (TiSi$_2$) throughout silicides 40, 46, 60, and 66; the silicides are about 1,500 Å thick. Where the titanium is present over silicon dioxide 50, 70, 76 and 80, TiN is rapidly formed which prevents lateral diffusion of silicon and formation of silicide very far beyond the borders of polysilicon 44 and 64 and the exposed portions of junctions 38 and 58. The reaction temperature is low enough to prevent the titanium from reacting with silicon dioxide 50, 70, 76 and 80 to form titanium oxides beyond a surface layer, and the exclusion of oxygen in the ambient during reaction likewise prevents titanium oxide formation. See FIG. 2D which illustrates the self-aligned nature of the silicidation.

(e) Strip any unreacted titanium and TiN 84 in an ammonium hydroxide/hydrogen peroxide solution, and anneal silicides 40, 46, 60, and 66 at 800° C. in an argon atmosphere. The anneal lowers the sheet silicide of the silicide to about 1Ω/□; see FIG. 2E.

(f) Form insulation 52, 72 as follows: deposit TEOS oxide to a thickness of 10,000 Å, spin on about 6,000 Å of photoresist, etch back to remove all of the photoresist plus about 6,000 Å of the TEOS oxide, deposit another 1,000 Å of TEOS oxide plus 3,000 Å of phosphosilicate glass (PSG) and reflow the PSG. The etched back TEOS plus reflowed PSG has good step coverage and forms insulation 52, 72. Next, photolithographically pattern and etch contact openings in insulation 52, 72 (this etch also removes oxide 80 which had masked the silicide formation on p junction 58), sputter deposit titanium:tungsten 41, 61 (2,000 Å) and aluminum 42, 62 (5,000 Å), and, lastly, photolithographically pattern and etch titanium:tungsten 41 and aluminum 42. The titanium:tungsten is a pseudoalloy having 10% by weight titanium and acts as a barrier to aluminum spiking through junction 58 during sintering. Sinter the aluminum at 450° C. This completes the device as shown in FIGS. 1A-B. Further oxide layers and metal layers could be added, together with passivation oxide and nitride layers.

Thus for contacts 30 the metal-to-junction contacts are through openings in the silicidation of the p+ junctions; otherwise the silicidation is standard and includes silicidation of both phosphorus-doped first level polysilicon lines such as gates 44 and 64 and p+ moat away from junctions 58. In the silicidation of both first level polysilicon and p+ moat, the specific contact resistivity is increased but is tolerable due to the large area of the silicide-to-silicon interface.

Figure 3:
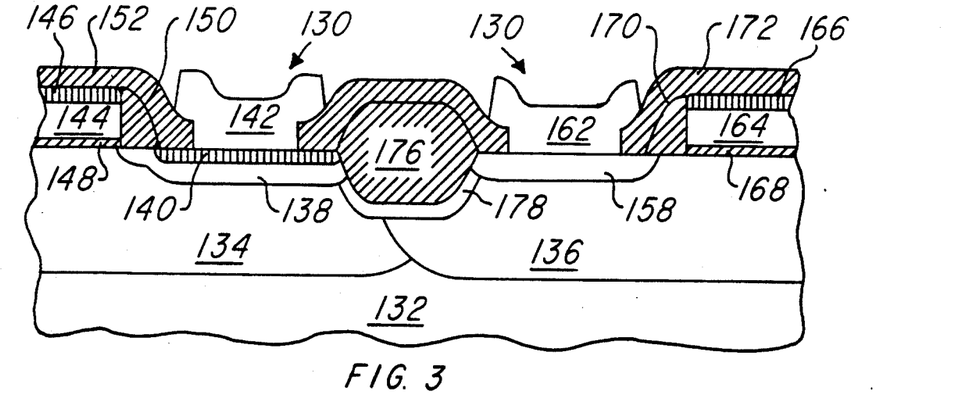
FIG. 3 shows in cross sectional elevation view a second preferred embodiment junction contact.

Second preferred embodiment junction contacts in a CMOS device are illustrated in cross sectional elevation view and generally denoted by reference numeral 130 in FIG. 3 where the lefthand portion of the Figure is part of an n channel MOSFET and the righthand portion is part of a p channel MOSFET. In particular, single crystal silicon substrate 132 is doped p type to form p well 134 for the n channel MOSFET and doped n type to form n well 136 for the p channel MOSFET; the n channel MOSFET includes n+ arsenic plus phosphorus doped junction 138 (which is either the source or the drain) covered by titanium silicide layer 140, aluminum with 1% silicon contact 142 on silicide 140, n+ doped polysilicon gate 144 covered by titanium silicide 146 and located on gate oxide 148, sidewall oxide 150, and insulation 152; the p channel MOSFET includes p+ boron doped junction 158 (which is either the source or the drain), aluminum contact 162 directly on junction 158, n+ doped polysilicon gate 164 covered by titanium silicide 166 and located on gate oxide 168, sidewall oxide 170, and insulation 172; and the MOSFETs are separated by field oxide 176 and channel stop 178.

For contacts 30 diffusion barrier 61 separated aluminum 62 from p+ junction 58: however, for contacts 130 aluminum 162 directly contacts p+ junction 158 and the aluminum has about 1% silicon added to avoid spiking through junction 158. Note that 1% silicon in the aluminum is in excess of the solubility limit at room temperature, so some silicon will precipitate from the aluminum after sintering; but this precipitated silicon will be doped p type by the aluminum and not be overly detrimental to the aluminum 162-junction 158 interface. With shallow junctions such as junction 158 there is some evidenced that spiking may occur even with 1% silicon doping of the aluminum; in such a case a diffusion barrier should be used.

If titanium silicide had been formed on the portion of junction 158 between aluminum contact 162 and sidewall oxide 170 (as in the p channel MOSFET in FIG. 1A), then the drain current would not flow through the silicide but only through the underlying junction because of the silicide-to-junction high specific resistivity. Thus the partial silicidation of a shallow p+ junction 158 would be detrimental because silicide formation will consume part of the junction and leave the remaining junction substantially shallower which increases resistivity between aluminum contact 162 and the channel underneath gate oxide 168. Indeed, for a 0.3 μm thick junction, the silicidation with 1,000 Å of titanium will consume about 40% of the junction.

Figure 4:
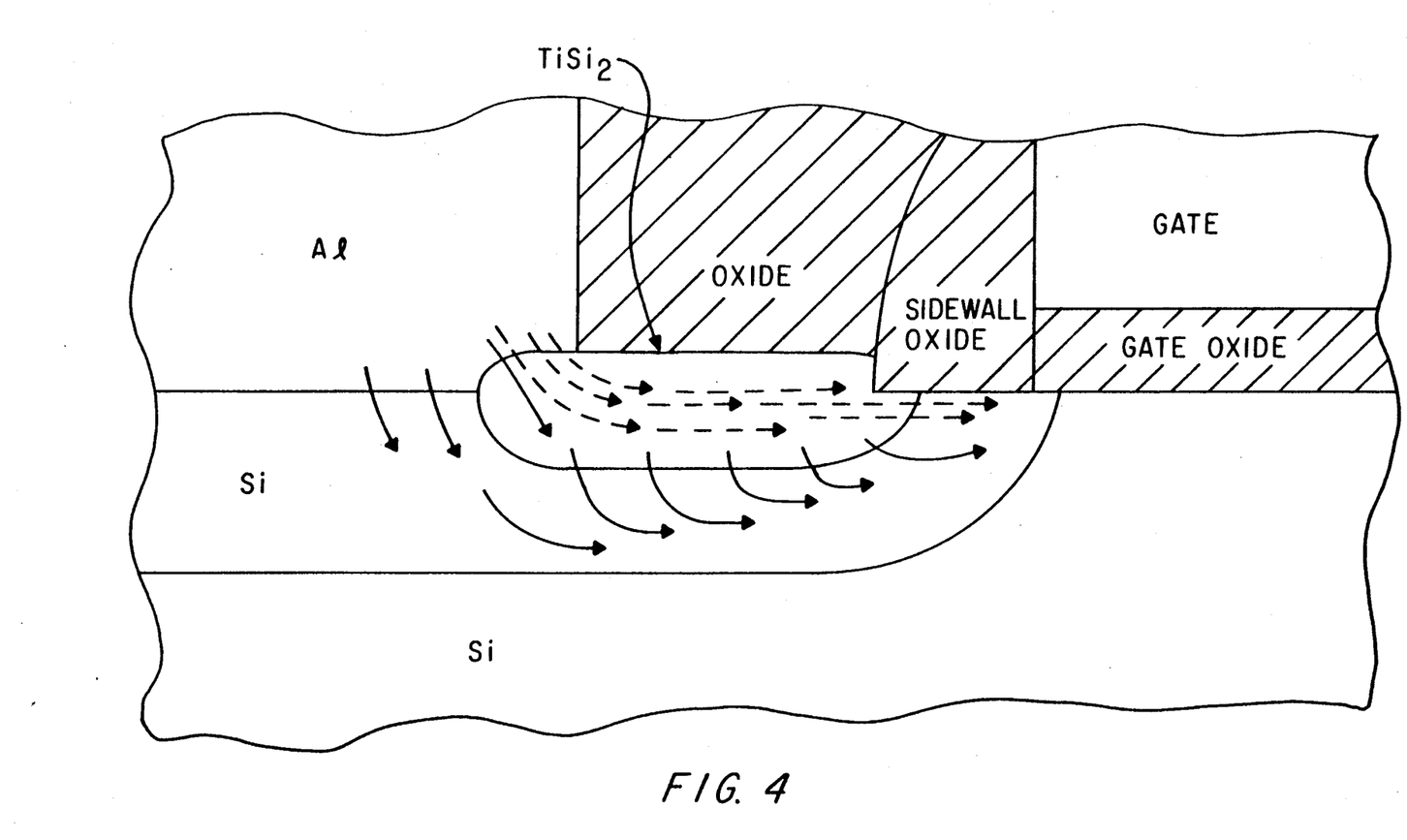
FIG. 4 illustrates current flow in a silicided junction.

In contrast, n+ junction 138 is totally covered by silicide 140 and aluminum 142 contacts silicide 140 only. FIG. 4 illustrates the differing current paths: the solid lines indicate the current path for the case of silicide-to-junction with high specific contact resistivity and the dashed lines indicate the current path for the case of low specific contact resistivity. In effect, the former case requires the current spread over the silicide-to-junction interface because this dominates the resistances involved; so the low resistance of the silicide is not effectively used and the squeezing of the junction by silicon consumption during silicidation is detrimental.

As with contacts 30, contacts 130 avoid the higher specific contact resistivity of silicide to p+ silicon contact by limiting formation of silicide on p+ silicon.

Further understanding and characteristics of junction contacts 130 follows from consideration of a second preferred embodiment method of fabrication of the CMOS device of FIG. 3 which is illustrated in cross sectional elevation views in FIG. 5A-D and includes the following steps:

(a) Begin with a standard CMOS substrate: <100> oriented silicon with a p+ epilayer 132 several microns thick and n well 136 and p well 134 in epilayer 132. Photolithographically define and implant channel stop 178 and grow field oxide 176 of thickness 7,000 Å. Grow gate oxide (148 and 168) and deposit, pattern and etch first level n+ polysilicon (144 and 164) of 4,500 Å thickness, and form sidewall oxides 150 and 170 on the gates by conformal deposition followed by anisotropic etching. Deposit 300 Å of TEOS pad oxide 180. Apply and pattern photoresist and implant boron through pad oxide 180 to form p+ source and drain 158 plus the remainder of the p+ moat. Strip the patterned photoresist, then apply and pattern second photoresist and implant arsenic and phosphorus through pad oxide 180 to form n+ source and drain 138 plus the remainder of the n+ moat. Then use the patterned photoresist as an etch mask to etch pad oxide 180. Strip the second patterned photoresist and anneal the implants; see FIG. 5A.

Figure 5A:
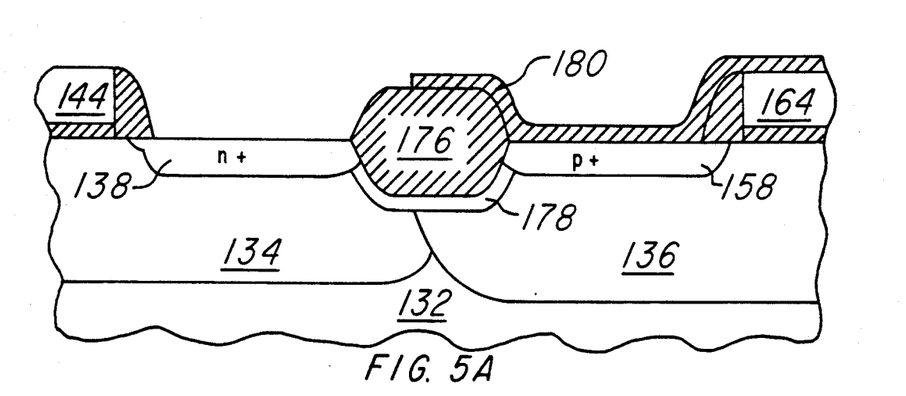
FIGS. 5A-D illustrate the steps of a second preferred embodiment method of fabrication of the contact of FIG. 3.
Figure 5B:
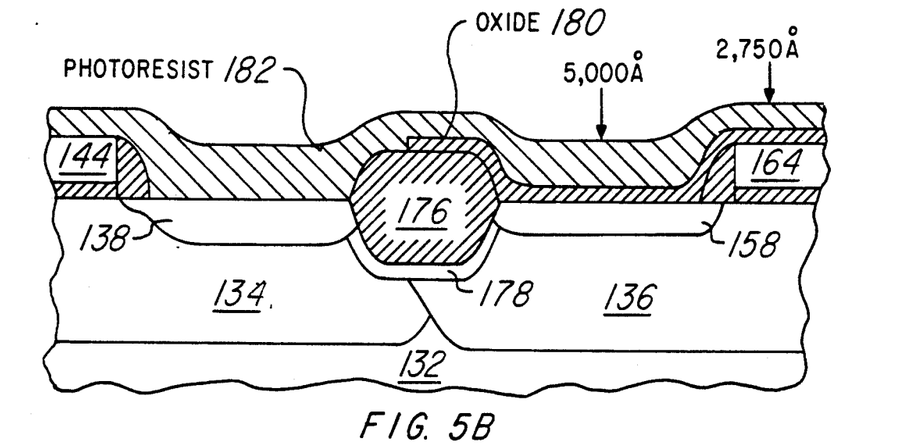
Figure 5C:
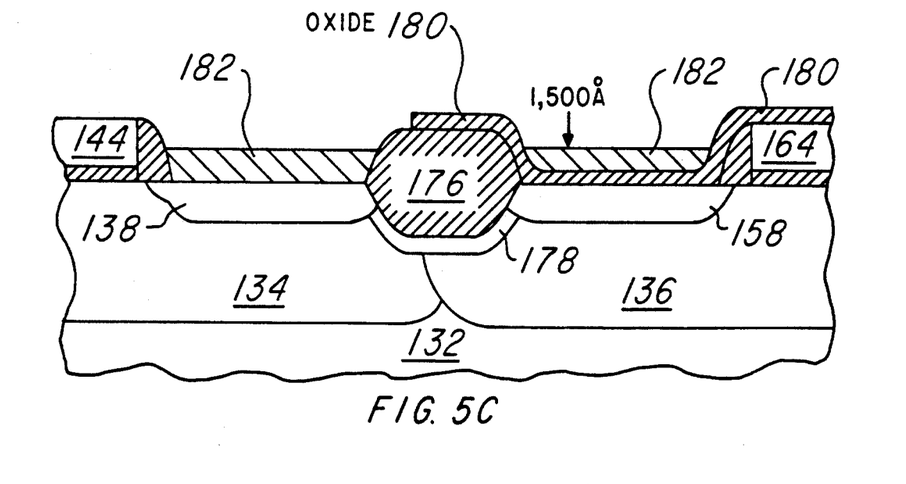
Figure 5D:
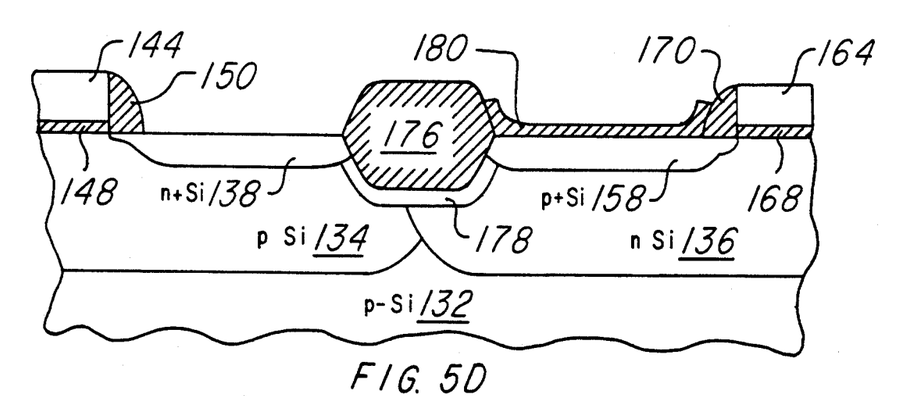

(b) Spin on 5,000 Å of photoresist 182; the photoresist will have a maximum thickness of 2,750 Å on top of first level polysilicon lines 144 and 164 as determined by computer simulation and experimental confirmation; see FIG. 5B.

(c) Plasma etch about 3,500 Å of photoresist 182; the etch is timed to stop before complete removal of photoresist 182. The etch exposes the portion of oxide 180 over the polysilicon lines 164 in the p+ area but keeps junctions 138 and 158 (in fact, all of the p+ and n+ moat area) covered by 1,500 Å of photoresist 182. See FIG. 5C.

(d) Plasma etch the exposed pad oxide 180 with photoresist 182 as the etch mask. Then strip photoresist 182; see FIG. 5D which shows the remnant pad oxide 180 covering only the p+ moat. The portion of the p+ moat away from junctions 158 may be used as a conductive line and desirably is silicided to lower its sheet resistance, so a further optional photoresist masking and etching of pad oxide 180 away from junctions 158 is also performed.

(e) Conformally deposit by sputtering a layer of titanium 1,000 Å thick on the structure of step (d) and proceed as in steps (d)-(f) of the first preferred embodiment method but using aluminum with 1% silicon instead of aluminum and without the titanium:tungsten diffusion barrier unless needed. This completes the devices illustrated in FIG. 3.

Figure 6A:
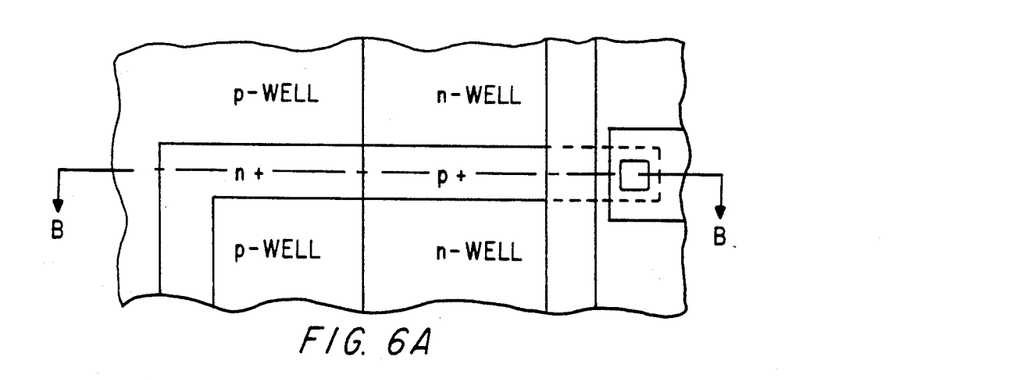
Figure 6B:
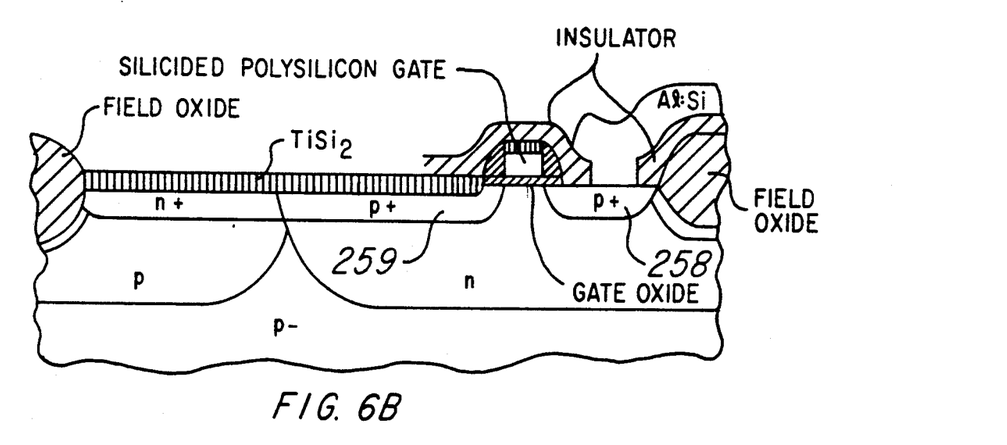

Frequently the p+ and n+ moats (diffusions) are used as conductive lines, and at the border of the p well with the n well such a conductive line will change from n+ moat to p+ moat and form a p-n junction. The p-n junction is normally shorted by the silicide formed on the moats as illustrated in FIGS. 6A-B, and with contacts 130 the silicidation of the portion of the p+ moat away from junctions 158 was accomplished by the optional etch of pad oxide 158 in step (d). Thus the use of contacts 130 together with n+-p+ moat butting requires the extra masking and etching step. In FIGS. 6A-B both the moat butting and a p channel MOSFET with one junction (259) silicided and the other (258) directly contacted with metal are illustrated.

Figure 7:
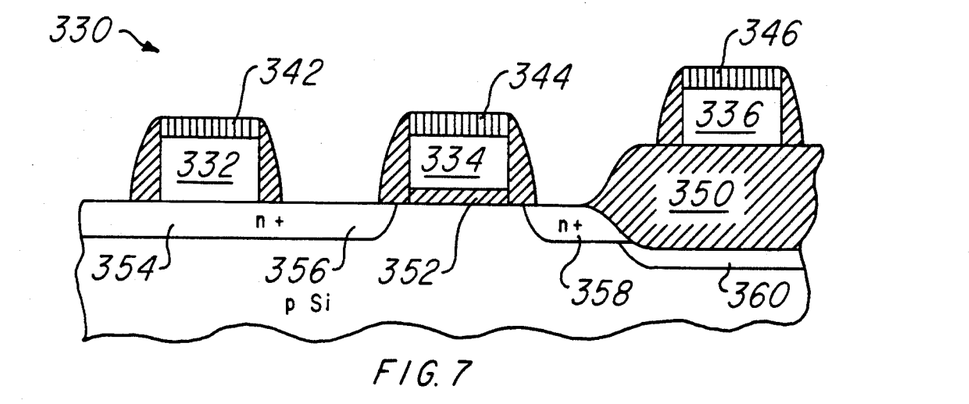
FIG. 7 illustrates a third preferred embodiment in cross sectional view.
Figure 8A:
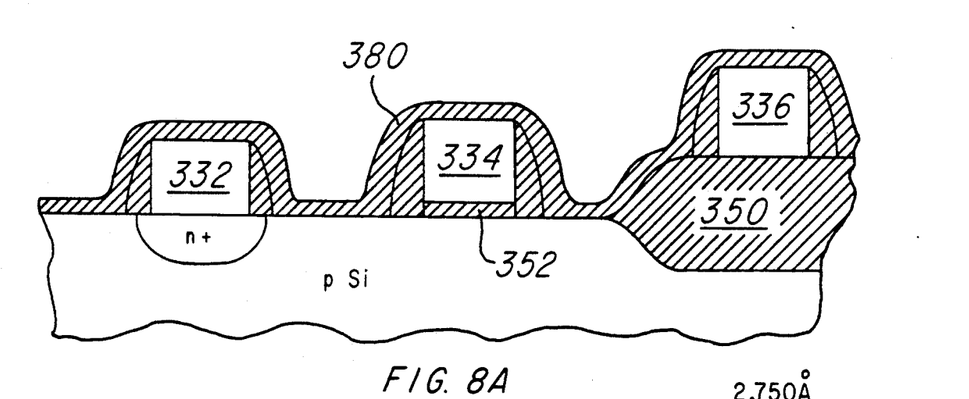
FIGS. 8A-D show the steps of a third preferred embodiment method of fabrication.

A third preferred embodiment silicided structure, generally denoted 330 and illustrated in cross sectional elevation view in FIG. 7, includes titanium silicided n+ polysilicon lines 332, 334, and 336 capped with titanium silicides 342, 344, and 346, respectively, field oxide 350, gate oxide 352. n+ moat 354 (including source 358 and drain 356), and sidewall oxides on the polysilicon lines. Note that the source and drain are not silicided. Polysilicon line 334 is the gate for the transistor with source 358 and drain 356; polysilicon line 332 is a buried contact to moat 354, and polysilicon line 336 is an interconnection line running across field oxide 350. The silicidation of polysilicon lines 332, 334, and 336 is by a third preferred embodiment method which is similar to the second preferred embodiment method and includes the following steps:

(a) Begin with a standard CMOS substrate: <100> oriented silicon with a p− epilayer several microns thick with a n well and p well in the epilayer. Photolithographically define and implant channel stop 36 and grow field oxide 350 of thickness 7,000 Å. Grow gate oxide (352) and deposit the first split of first level polysilicon of LPCVD. Pattern and etch the buried contact openings in the polysilicon and gate oxide, and deposit, pattern and etch the second split of first level polysilicon to form lines line 332 of 3,250 Å thickness and lines 334 and 336 of 4,500 Å thickness. Dope polysilicon lines 332, 334, and 336 by POCl$_3$ (the phosphorus diffuses through polysilicon 332 to dope the moat at the buried contact), and form sidewall oxides on the polysilicon lines by conformal deposition followed by anisotropic etching. Deposit 300 Å of TEOS pad oxide 380. See FIG. 8A.

Figure 8B:
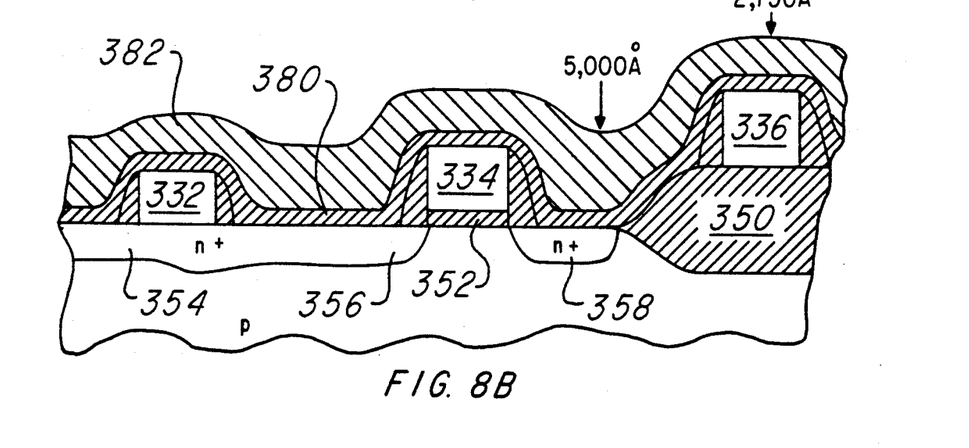
Figure 8C:
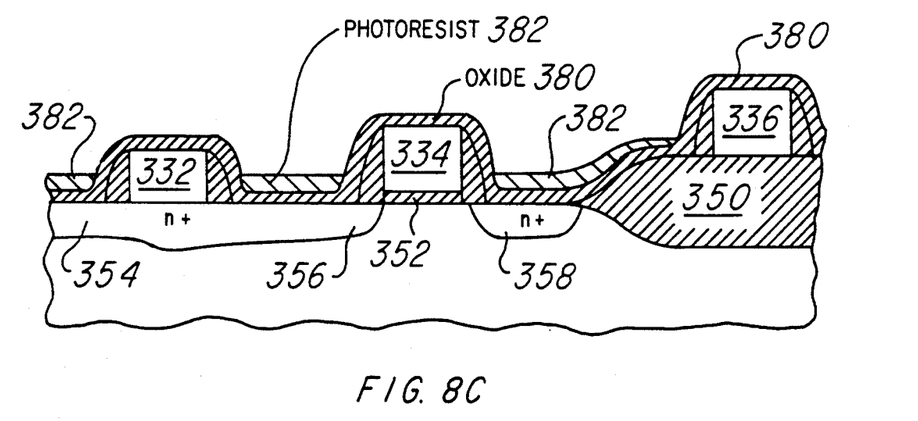
Figure 8D:
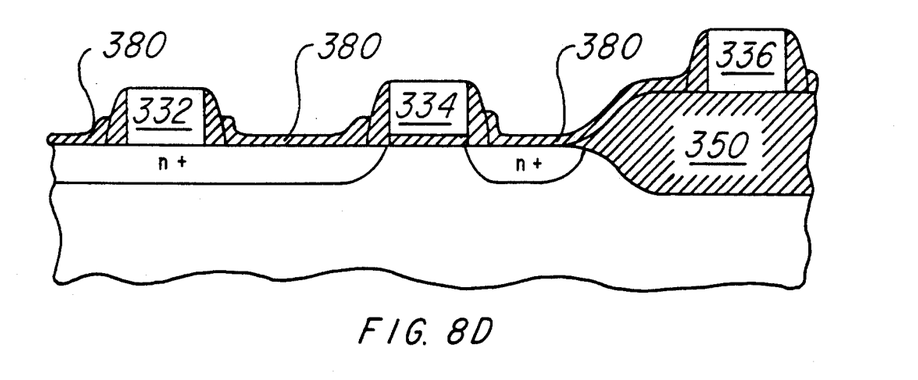

(b) Apply and pattern photoresist and implant boron through pad oxide 380 to form p+ source and drain (not shown in FIGS. 7 and 8A-D) plus the remainder of the p+ moat. Note that there are no buried contacts to the p+ moat because the first level polysilicon is doped n+. Strip the patterned photoresist, then apply and pattern second photoresist and implant arsenic and phosphorus through pad oxide 380 to form n+ source 358 and drain 356 plus the remainder of the n+ moat 354. Strip the second patterned photoresist and anneal the implants. Spin on 5,000 Å of photoresist 382; the photoresist will have a maximum thickness of 2,750 Å on top of first level polysilicon lines 332, 334, and 336 as determined by computer simulation and experimental confirmation; see FIG. 8B.

(c) Plasma etch about 3,500 Å of photoresist 382; the etch is timed to stop before complete removal of photoresist 382. The etch exposes the portion of oxide 380 over the polysilicon lines 332, 334, and 336 but leaves the moat areas covered by 1,500 Å of photoresist 382. See FIG. 8C.

(d) Plasma etch the exposed pad oxide 380 with photoresist 382 as the etch mask. Then strip photoresist 382; see FIG. 8D which shows the remnant pad oxide 380 covering only the moats.

(e) Conformally deposit by sputtering a layer of titanium 1,000 Å thick on the structure of step (d) and proceed as in steps (d)-(e) of the first preferred embodiment method; and etch pad oxide 380. This completes the structure illustrated in FIG. 7.

The advantages of the third preferred embodiment method of siliciding polysilicon lines include the avoidance of etching silicide. Standard silicidation methods for first level polysilicon deposit the polysilicon, silicide it (either by deposition of silicide or by deposition of metal followed by reaction with the polysilicon), and then pattern and etch the silicide plus polysilicon. The standard approach requires a silicide pattern and etch; but silicide surfaces are rough which make fine line patterning difficult and silicide etchants are similar to other metals' etchants. For example, CF$_4$ must be used and has limited selectivity with respect to photoresist, oxide, polysilicon, and so forth. Contrarily, the third preferred embodiment uses a selective silicidation after patterning and etching of the polysilicon lines. Of course, the third preferred embodiment method will also apply to second level polysilicon lines and other structures.

MODIFICATIONS AND ADVANTAGES

Various modifications of the preferred embodiment devices and methods may be made while retaining the features of direct metal to silicon contact in silicided structures and silicidation of polysilicon lines after patterning and etching without necessarily also siliciding moats or other silicon regions. For example, a combination of both features with an oxide mask on a polysilicon line so that subsequent silicidation leaves an opening for direct metal to polysilicon line contact may be of use. More generally, the dimensions and shapes of the preferred embodiments may be widely varied such as the sidewall oxides could have been omitted; the aluminum contacts may be other alloys of aluminum such as copper:aluminum or other metals such as tungsten and may have other diffusion barriers; the illustrative CMOS structures could also have been NMOS or PMOS, or in fact, bipolar, BiCMOS, CCD, or other technologies which use silicides. The segregation of dopants (boron and phosphorus) into titanium silicide results in the high specific contact resistance avoided by the preferred embodiments, so if other silicides were used (for example, $CoSi_2$ or PtSi) and the silicon dopants involved segregated into the silicide, then the direct metal to silicon contacts would be useful; and if the other silicide could be formed by a metal deposition on polysilicon lines followed by a silicidation reaction, then the silicidation of the polysilicon lines without concurrent silicidation of the moats would also be useful.

Other materials, such as germanium, gallium arsenide or other semiconductors, which can use silicides or other compounds (borides, nitrides, aluminides, and so forth) may use the inventive features with the corresponding materials.

The invention provides the advantages of silicidation to lower sheet resistance without the drawbacks of high specific contact resistivity or silicide etching. As feature size of integrated circuits decreases, the advantages and drawbacks avoided increase in importance. And these advantages are obtained with only simple modifications of standard processing methods.

What is claimed is:

1. An integrated circuit, comprising:
   the substrate;
   insulating regions formed at the surface of said substrate;
   a layer of metal silicide formed on the surfaces of said substrate not covered by said insulating layer;
   a hole formed in selected portions of said metal silicide layer; and
   a conductive layer formed on the surface of said integrated circuit and patterned to provide selected conductors, said conductive layer extending to the surface of said substrate and contacting said substrate where said holes were formed.

2. The integrated circuit of claim 1 wherein said metal silicide is selected from the group of titanium silicide, molybdenum silicide and tantalum silicide.

3. The integrated circuit of claim 1 wherein said conductive layer comprises aluminum.

4. The integrated circuit of claim 1 wherein said insulating areas comprise silicon dioxide.

5. The integrated circuit of claim 1 wherein said metal silicide layer is formed by reacting a layer of metal with said substrate.

6. The integrated circuit of claim 1 wherein said holes are formed above P+ doped contact regions in said substrate.

* * * * *